(12) United States Patent
Chen

(10) Patent No.: US 6,510,054 B1
(45) Date of Patent: *Jan. 21, 2003

(54) HEAT SINK CLIP ASSEMBLY WITH HANDLES

(75) Inventor: Chun-Chi Chen, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/045,852

(22) Filed: Oct. 26, 2001

(30) Foreign Application Priority Data

Jul. 20, 2001 (TW) ........................................ 090212266

(51) Int. Cl.7 ................................................. H05K 7/20
(52) U.S. Cl. ..................................................... 361/704
(58) Field of Search ................................. 361/687, 703, 361/704, 709–712, 717–719; 174/16.3; 165/80.3, 185; 24/453, 457, 458, 625, 459; 248/316.7, 505, 510; 257/718, 719, 722, 726, 727; 267/150, 158

(56) References Cited

U.S. PATENT DOCUMENTS

| | | | | |
|---|---|---|---|---|
| 4,660,123 A | * | 4/1987 | Hermann ..................... 165/185 |
| 5,464,054 A | * | 11/1995 | Hinshaw et al. ............. 165/185 |
| 5,486,981 A | * | 1/1996 | Blomquist .................... 165/185 |
| 5,615,735 A | * | 4/1997 | Yoshida et al. .............. 165/80.3 |
| 5,640,305 A | * | 6/1997 | Smithers ................. 24/DIG. 51 |
| 5,990,552 A | * | 11/1999 | Xie et al. ..................... 257/712 |
| 6,118,659 A | * | 9/2000 | Adams et al. ............... 174/16.3 |
| 6,229,703 B1 | * | 5/2001 | Lee .............................. 24/458 |
| 6,390,475 B1 | * | 5/2002 | Eckblad et al. ............. 165/80.3 |

\* cited by examiner

Primary Examiner—Boris Chervinsky
(74) Attorney, Agent, or Firm—Wei Te Chung

(57) ABSTRACT

A heat sink clip assembly includes clip (20) and two handles (40) attached to the clip for facilitating operation. The clip is integrally made of spring steel wire. The clip has a horizontal pressing section (22) and two spring arms (24) extending perpendicularly from opposite ends of the pressing section. The spring arms extend generally upwardly in different directions from the pressing section. A hook (28) is formed at a free end of each spring arm. Each handle has a rectangular base plate (42) and two fixing blocks (44) formed at diagonally opposite corners of the base plate. The blocks extend toward each other along two orthogonal edges of the base plate. A groove (48) is defined in an inner side surface of each block. The grooves are parallel to the base plate, and respectively accommodate part of the pressing section and part of one of the spring arms.

16 Claims, 3 Drawing Sheets

HEAT SINK CLIP ASSEMBLY WITH HANDLES

BACKGROUND OF THE INVENTION

1. Field of the Invention

The present invention relates to securing of heat sinks to electronic devices, and particularly to heat sink clip assemblies having handles for facilitating operation.

2. Related Art

Advances in microelectronics technology have resulted in electronic devices which process signals and data at unprecedented high speeds. During operation of many contemporary electronic devices such as central processing units (CPUs), large amounts of heat are produced. The heat must be efficiently removed, to prevent the system from becoming unstable or being damaged.

Typically, a heat sink assembly comprises a heat sink, a fan and a clip attached at a periphery of the electronic device. The clip is often integrally made of spring steel wire. An example of such heat sink assembly is disclosed in Taiwan Patent No. 332721. A wire clip comprises a horizontal pressing section and two spring arms extending from two opposite ends of the pressing section. A hook is formed at a distal end of each spring arm, to resiliently engage with a part at a periphery of the electronic device. The clip thereby presses the heat sink onto a top surface of the electronic device. Unfortunately, the wire is typically small and slippery. In assembly, an operator's finger is prone to slip off the surface of the clip. The resultant inconvenience and inefficiency is particularly costly in mass production assembly lines.

Thus, an improved heat sink clip assembly which overcomes the above problem is desired.

BRIEF SUMMARY OF THE INVENTION

Accordingly, an object of the present invention is to provide a clip assembly which readily and securely attaches a heat sink to an electronic device.

Another object of the present invention is to provide a clip assembly with handles for facilitating operation.

A further object of the present invention is to provide a clip assembly which is simple and cost-efficient.

To achieve the above-mentioned objects, a heat sink clip assembly comprises a clip and a pair of handles attached to the clip for facilitating operation. The clip is integrally made of spring steel wire. The clip has a horizontal pressing section and two spring arms extending perpendicularly from opposite ends of the pressing section. The spring arms extend generally upwardly in different directions from the pressing section. A hook is formed at a free end of each spring arm. Each handle has a rectangular base plate and two fixing blocks formed at diagonally opposite corners of the base plate. The fixing blocks extend toward each other along a pair of orthogonal edges of the base plate. A groove is defined in an inner side surface of each fixing block. The grooves are parallel to the base plate and respectively accommodate part of the pressing section and part of one of the spring arms.

Other objects, advantages and novel features of the present invention will be drawn from the following detailed description of a preferred embodiment of the present invention together with the attached drawings, in which:

DESCRIPTION OF THE PREFERRED EMBODIMENT

Figure 1:
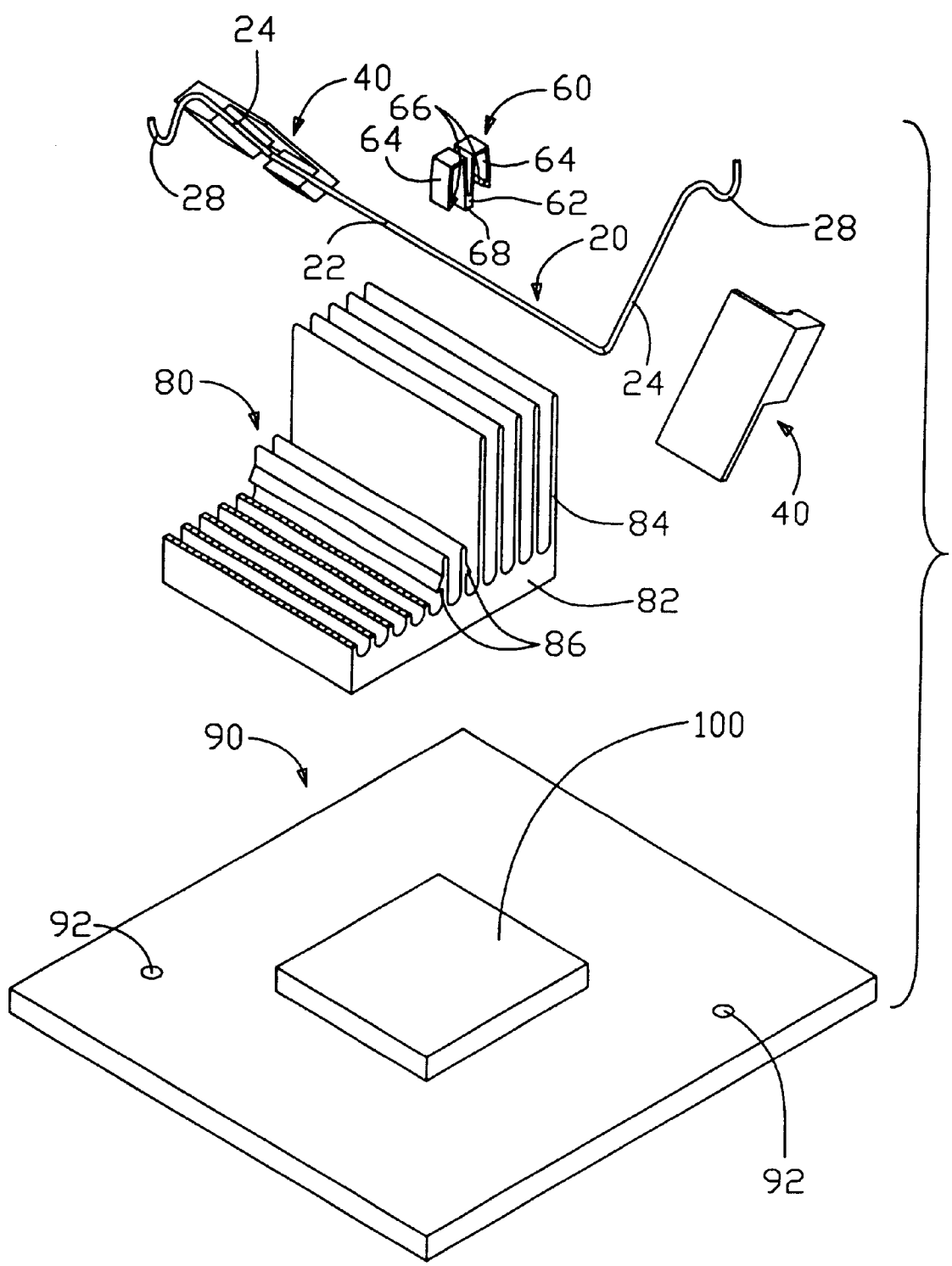
FIG. 1 is an exploded view of a heat sink clip assembly in accordance with the present invention, used in conjunction with a fastener to press a heat sink onto a chipset mounted on a motherboard.

Referring to FIG. 1, a heat sink clip assembly in accordance with the present invention comprises a clip 20 and a pair of handles 40. The clip 20 is used in conjunction with a fastener 60 to press a heat sink 80 onto a chipset 100 mounted on a motherboard 90. A pair of through holes 92 is defined in the motherboard 90 in the vicinity of two diagonally opposite corners of the chipset 100. The heat sink 80 comprises a base 82 and a plurality of parallel fins 84 extending upwardly therefrom. Two adjacent central fins 84 are substantially shorter than all remaining fins 84. A pair of horizontal ridges 86 is formed on lower portions of respective outmost faces of the central fins 84. The ridges 86 are parallel to each other and equidistant from the base 82, and engage with the fastener 60.

The clip 20 comprises a horizontal pressing section 22, and a pair of spring arms 24 extending perpendicularly from opposite ends of the pressing section 22 respectively. The spring arms 24 both extend generally upwardly, but in different directions from the pressing section 22. A difference in the said directions is approximately 90?. A hook 28 is formed at a distal end of each spring arm 24. The clip 20 may be made of any elastically deformable material, such as hardened spring steel wire. A cross section at any point along the clip 20 is generally circular.

The fastener 60 is integrally made of plastic or other suitable material. The fastener 60 comprises a central basal body 62, two pressing portions 64, and a pair of catches 66. Each pressing portion 64 extends upwardly from the basal body 62, then horizontally outwardly, and then downwardly. Each pressing portion 64 thus has an inverted U-shape, enabling it to accommodate the corresponding fin 84 having the ridge 86. Each catch 66 extends inwardly from a free end of each pressing portion 64, for engaging with the ridge 86 of the corresponding fin 84. A longitudinal notch 68 is defined in a bottom surface of the basal body 62. The notch 68 has a generally arcuate profile, and facilitates abutting of the pressing section 22 of the clip 20 against the base 82 of the heat sink 80.

Figure 2:
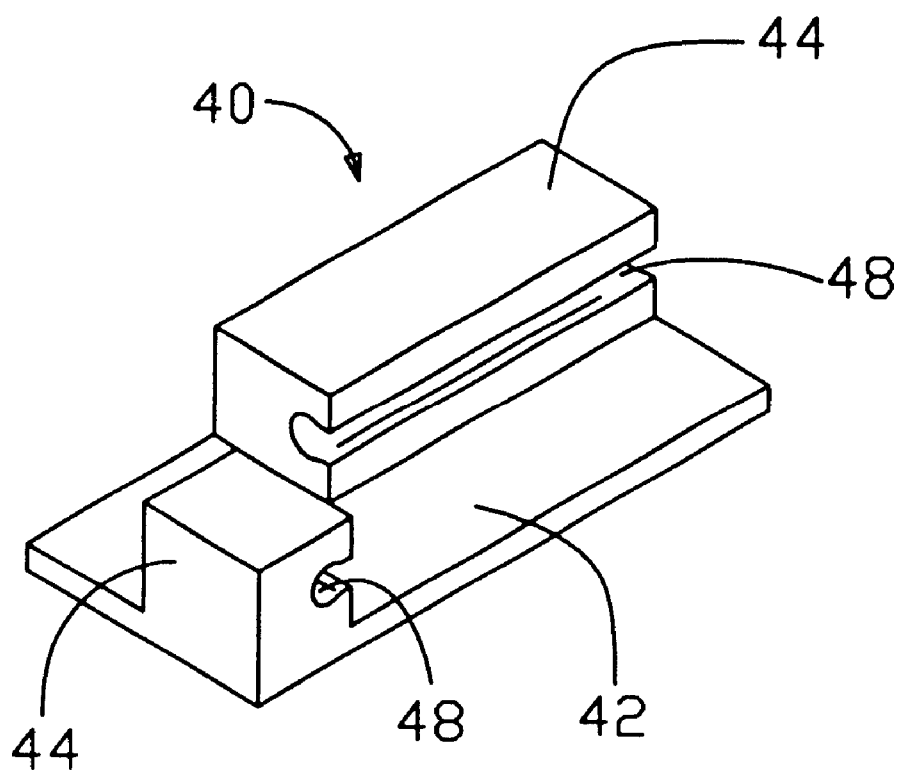
FIG. 2 is a perspective view of a handle of the heat sink clip assembly of FIG. 1.

The two handles 40 are identical. Referring to FIG. 2, each handle 40 is integrally made of plastic or other suitable material. The handle 40 comprises a rectangular base plate 42 and two fixing blocks 44 formed on a main surface of the base plate 42. An opposite surface of the base plate 42 is for manual pressing during operation. The blocks 44 are formed at two diagonally opposite corners of the base plate 42 respectively, and extend toward each other along a pair of orthogonal edges of the base plate 42. A groove 48 is defined in an inner side surface of each block 44. Each groove 48 is parallel to the base plate 42, and the two grooves 48 are equidistant from the base plate 42.

Figure 3:
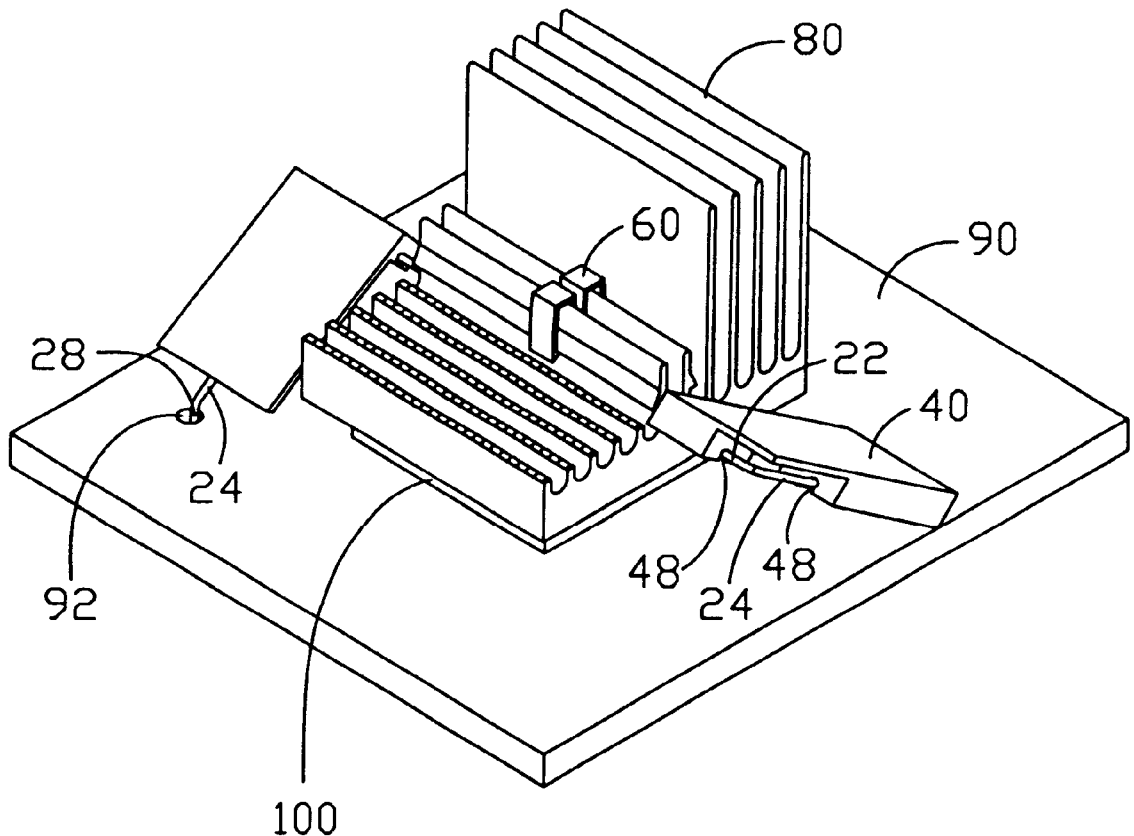
FIG. 3 is an assembled view of FIG. 1.

Referring also to FIG. 3, in assembly, each handle 40 is mounted to the clip 20 at a junction of the pressing section 22 and one spring arm 24. The grooves 48 of the handle 40 respectively accommodate part of the pressing section 22 and part of one spring arm 24. Then, the combined clip 20 and handles 40 is placed onto the heat sink 80. The pressing section 22 of the clip 20 is accommodated in a space (not labeled) of the heat sink 80 between the two central fins 84 having the ridges 86. Then, the fastener 60 is attached to the heat sink 80. The basal body 62 is accommodated in the said space between the two central fins 84. The pressing portions 64 of the fastener 60 are pressed downwardly until the catches 66 of the fastener 60 snappingly engage with the ridges 86 of the heat sink 80. The fastener 60 at the notch 68 abuts against the pressing section 22 of the clip 20. Thus the fastener 60 is secured onto the heat sink 80, and prevents the clip 20 from falling out of the heat sink 80.

The heat sink 80 together with the clip assembly is then placed onto the chipset 100 on the motherboard 90. One handle 40 is depressed so that the proximate hook 28 of the clip 20 is extended through the corresponding through hole 92 of the motherboard 90. The said proximate hook 28 is thus loosely engaged with a bottom surface of the motherboard 90. Then, the other handle 40 is depressed so that the other hook 28 of the clip 20 is extended through the other through hole 92 of the motherboard 90. The said other hook 28 is thus resiliently engaged with the bottom surface of the motherboard 90, and the said proximate hook 28 simultaneously becomes resiliently engaged with the bottom surface of the motherboard 90. Thus, the heat sink 80 is pressingly and securely attached to the chipset 100 by the clip 20.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink clip assembly comprising:
   a clip adapted to attach a heat sink to a chipset mounted on a motherboard, the clip comprising a pressing section and a pair of spring arms extending generally upwardly from opposite ends of the pressing section, an engaging portion being formed at a distal end of each spring arm and adapted to engage with the motherboard; and
   at least one handle, each handle attached to part of the pressing section and part of one spring arm, for facilitating operation of the clip to engage the spring arms with the motherboard; wherein
      each handle comprises a base plate and two blocks formed at diagonally opposite comers of the base plate, the blocks extending toward each other along a pair of orthogonal edges of the base plate.

2. The heat sink clip assembly as described in claim 1, wherein the clip is made of spring steel wire.

3. The heat sink clip assembly as described in claim 1, wherein each of the spring arms is generally perpendicular to the pressing section.

4. The heat sink clip assembly as described in claim 1, wherein two grooves are respectively defined in inner side surfaces of the blocks, and the grooves respectively accommodate the part of the pressing section and the part of the spring arms.

5. The heat sink clip assembly as described in claim 1, wherein each handle is integrally made of plastic material.

6. The heat sink clip assembly as described in claim 1, wherein the engaging portions of the clip comprise a pair of hooks adapted to extend through corresponding through holes of the motherboard.

7. A heat sink assembly comprising:
   a motherboard;
   a chipset mounted on the motherboard;
   a heat sink attached onto the chipset, the heat sink having a base and a plurality of fins extending upwardly from the base;
   a clip attaching the heat sink to the chipset, the clip comprising a pressing section, a pair of spring arms extending generally upwardly from distal ends of the pressing section, and a pair of engaging portions formed at distal ends of the spring arms and engaging with the motherboard; and
   a handle engaged with a portion of one of the spring arms and a portion of the pressing section, the handle thereby being securely attached to the clip; wherein
   the handle comprises a base plate, two orthogonal fixing blocks formed on two diagonally opposite comers of the base plate, and two grooves respectively defined in inner side surfaces of the blocks for accommodating the portion of one of the spring arms and the portion of the pressing section.

8. The heat sink assembly as described in claim 7, wherein the clip is integrally made of spring steel wire.

9. The heat sink assembly as described in claim 7, wherein the heat sink further forms a pair of ridges on respective outmost faces of two adjacent central fins, and the pressing section of the clip is accommodated between the two adjacent central fins, and wherein the heat sink assembly further comprises a fastener, the fastener having a basal body accommodated between the two adjacent central fins and pressing the pressing section of the clip onto the base of the heat sink, two pressing portions extending upwardly from the basal body and then generally horizontally outwardly and then downwardly, and two catches respectively extending inwardly from distal ends of the pressing portions and engaging with the ridges.

10. The heat sink assembly as described in claim 7, wherein the pressing section is received between two adjacent fins of the heat sink, the assembly further comprising a fastener pressing the pressing section toward the base of the heat sink and being secured to the adjacent fins.

11. The heat sink assembly as described in claim 10, wherein each of the two adjacent fins forms a ridge, and the fastener forms two catches engaging with the ridges.

12. The heat sink assembly as described in claim 11, wherein the fastener defines a notch in a bottom face thereof, the pressing section of the clip fitting in the notch.

13. The heat sink assembly as described in claim 7, wherein the engaging portions of the clip comprise a pair of hooks adapted to extend through corresponding through holes of the motherboard.

14. A method for mounting a heat sink onto a chip on a printed circuit board, comprising:
   (a) providing a chip mounted on a printed circuit board,
   (b) providing a heat sink on the chip, wherein the heat sink has a clip having a pressing section abutting against the heat sink and two spring arms extending upwardly from opposite ends of the pressing section, each of a pair of handles made of plastic material being attached to a portion of the pressing section and a portion of one spring arm, the clip with the handles being pre-assembled to the heat sink; and
   (c) pressing the handles toward the printed circuit board to fix the spring arms relative to the printed circuit board, whereby the pressing section exerts a depressing force on the heat sink to cause the heat sink to have firm engagement with the chip; wherein each handle comprises two orthogonally extending blocks each defining a groove therein, the portion of the pressing section and the portion of the one spring arm fitting in the grooves.

15. The method as described in claim 14, wherein the pressing section is received between two adjacent fins of the heat sink and wherein the heat sink further comprises a fastener mounted to the two adjacent fins to depress the pressing section toward a base of the heat sink.

16. The method as described in claim 14, wherein each spring arm of the clip forms a hook about a free end thereof, and the printed circuit board is provided with two holes around diagonal corners of the chip, and wherein during step (c), the hooks are forced to fit in the holes such that the spring arms are fixed relative to the printed circuit board.

\* \* \* \* \*